United States Patent
Kotani et al.

(10) Patent No.: US 11,357,149 B2
(45) Date of Patent: Jun. 7, 2022

(54) COMPONENT ORIENTATION DETERMINATION DATA CREATION DEVICE AND COMPONENT ORIENTATION DETERMINATION DATA CREATION METHOD

(71) Applicant: FUJI CORPORATION, Chiryu (JP)

(72) Inventors: Kazuya Kotani, Toyota (JP);
Masafumi Amano, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 631 days.

(21) Appl. No.: 15/571,947

(22) PCT Filed: May 21, 2015

(86) PCT No.: PCT/JP2015/064655
§ 371 (c)(1),
(2) Date: Nov. 6, 2017

(87) PCT Pub. No.: WO2016/185615
PCT Pub. Date: Nov. 24, 2016

(65) Prior Publication Data
US 2018/0124963 A1    May 3, 2018

(51) Int. Cl.
*H05K 13/08*    (2006.01)
*G06T 7/73*    (2017.01)
(Continued)

(52) U.S. Cl.
CPC .............. *H05K 13/08* (2013.01); *G06T 7/70* (2017.01); *G06T 7/74* (2017.01); *H05K 13/0818* (2018.08);
(Continued)

(58) Field of Classification Search
CPC ............... H05K 13/08; H05K 13/0812; H05K 13/0813; H05K 13/0818; G06T 2207/3014; G06T 2207/30141; G06K 9/3208
See application file for complete search history.

(56) References Cited

U.S. PATENT DOCUMENTS

| 5,416,335 A | 5/1995 | Forehand |
| 6,490,369 B1 | 12/2002 | Beiman |

(Continued)

FOREIGN PATENT DOCUMENTS

| JP | 2-21247 A | 1/1990 |
| JP | 2-44235 A | 2/1990 |

(Continued)

OTHER PUBLICATIONS

Eiji et al., Machine Translation of JP06-123611A, May 6, 1994 [retrieved on May 15, 2020], Retrieved from the Internet: <URL: https://www.j-platpat.inpit.go.jp/p0200>. (Year: 1994).*
Extended European Search Report dated May 17, 2018 in Patent Application No. 15892614.7, 8 pages.
International Search Report dated Aug. 4, 2015, in PCT/JP2015/064655, filed May 21, 2015.

*Primary Examiner* — John E Breene
*Assistant Examiner* — Liam R Casey
(74) *Attorney, Agent, or Firm* — Oblon, McClelland, Maier & Neustadt, L.L.P.

(57) ABSTRACT

A component orientation determination data creation device for creating component orientation determination data used in a component orientation determination system that determines an orientation of the component by comparing a brightness value of a determination region specified in the component orientation determination data within an image of the component captured by a camera with a determination threshold. A difference image between an image of the component in a correct orientation and an image of the component in another orientation is calculated by acquiring (Continued)

multiple images of the component in different orientations by changing the orientation with respect to the camera of the component that is the target for the component orientation determination data creation.

6 Claims, 7 Drawing Sheets

(51) Int. Cl.
    *G06T 7/70*     (2017.01)
    *G06V 10/20*     (2022.01)
    *G06V 20/64*     (2022.01)

(52) U.S. Cl.
    CPC .. *G06T 2207/30141* (2013.01); *G06V 10/255* (2022.01); *G06V 20/64* (2022.01)

(56) References Cited

U.S. PATENT DOCUMENTS

| | | | |
|---|---|---|---|
| 6,711,293 B1* | 3/2004 | Lowe | G06K 9/4671 |
| | | | 382/219 |
| 2006/0093205 A1* | 5/2006 | Bryll | G06T 7/0004 |
| | | | 382/152 |
| 2012/0162405 A1* | 6/2012 | Inagaki | G01N 21/95684 |
| | | | 348/87 |
| 2014/0111639 A1 | 4/2014 | Tanaka et al. | |

FOREIGN PATENT DOCUMENTS

| | | | |
|---|---|---|---|
| JP | 6-123611 A | | 5/1994 |
| JP | 2009-76796 A | | 4/2009 |
| JP | 2009-94375 A | | 4/2009 |
| JP | 2010054269 A | * | 3/2010 |
| JP | 2010256223 A | * | 11/2010 |

* cited by examiner

COMPONENT ORIENTATION DETERMINATION DATA CREATION DEVICE AND COMPONENT ORIENTATION DETERMINATION DATA CREATION METHOD

TECHNICAL FIELD

The present application relates to a component orientation determination data creation device and component orientation determination data creation method for creating component orientation determination data used to determine a orientation of a component for components for which determining the orientation (such as top and bottom orientation, or left and right orientation) is difficult by recognizing the outer shape of the component.

BACKGROUND ART

When a component mounter mounts a component on a circuit board, if the component is mounted in the wrong orientation (such as the top and bottom orientation, or the left and right orientation), because the electrodes or terminals of the component will not be connected correctly to the lands of the circuit board, a defective board will be produced. Therefore, conventionally, an image of a component picked up by a suction nozzle of the component mounter is captured from below by a camera, and a determination is made as to the orientation of the component by image processing.

Conventionally, as an example of a means for determining the orientation of a component using image processing, as disclosed in patent literature 1 (JP-H2-44235), a polarity mark is provided on the component, and the orientation of the component is determined by recognizing the polarity mark using image processing; however, this method cannot be applied to a component without a polarity mark.

Further, even if there is no polarity mark, it is sometimes possible to determine the up-down or left-right orientation of a component using only image recognition of the outer shape of the component, but in many cases the orientation of the component cannot be determined from only image recognition of the outer shape of the component.

For example, for a component for which the outer shape is recognized as being the same by image recognition even when the component is flipped (to be upside down), the up-down orientation of the component cannot be determined from the outer shape; however, even in this case, there are components for which there is a region for which a brightness value differs greatly between the top and bottom, and determination of the up-down orientation of the component is performed by using image processing to calculate a brightness value for a region for which the brightness value varies greatly between the top and bottom of the component, and comparing the brightness value of that region to a determination threshold.

In this case, the region for which the brightness value differs greatly based on whether the top or bottom of the component is facing up is specified in component orientation determination data included in image processing data used in the image processing. Creation of this component orientation determination data is performed by trial and error by an experienced operator possessing data creation skills.

CITATION LIST

Patent Literature

Patent literature 1: JP-A-H2-44235

SUMMARY

Technical Problem

As mentioned above, conventional component orientation determination data creation suffers from the problems that, because creation needs to be performed by trial and error by an experienced operator possessing data creation skills, work of creating component orientation determination data is difficult, so it is difficult for an inexperienced operator to create appropriate component orientation determination data, and, even with an experienced operator, repeated trial and error is required, meaning that creating appropriate component orientation determination data takes time.

Thus, to solve the above problems, the present disclosure enables appropriate component orientation determination data to be easily created in a short time, even for an operator who is inexperienced in component orientation determination data creation.

Solution to Problem

To solve the above problems, the present disclosure is a component orientation determination data creation device for creating component orientation determination data used in a component orientation determination system that determines an orientation of the component by comparing a brightness value of a determination region specified in the component orientation determination data within an image of the component captured by a camera with a determination threshold, the component orientation determination data creation device including: a difference image calculating means configured to calculate a difference image between an image of the component in a correct orientation and an image of the component in another orientation by acquiring multiple images of the component in different orientations by changing the orientation with respect to the camera of the component that is the target for the component orientation determination data creation; and a component orientation determination data calculating means configured to obtain a region for which the brightness difference within the difference image is maximized or is equal to or greater than a specified value, and to calculate the component orientation determination data including position information that specifies the determination region inside the region.

With the present disclosure, by calculating a difference image between an image of the component in the correct orientation and an image of the component in another orientation, it is possible to easily automatically determine a region for which the brightness difference between the image of the component in the correct orientation and the image of the component in the other orientation is greatest or equal to or greater than a specified value (that is, a region by which the two images can be clearly distinguished) from a waveform of the brightness difference of the difference image. Thus, it is possible for appropriate component orientation determination data to be easily created in a short time, even for an operator who is inexperienced in component orientation determination data creation.

In this case, if the imaging conditions (for example, camera exposure time, lighting pattern, illumination conditions such as illumination brightness) are changed, because the waveform of the brightness difference of the difference image changes, the maximum value of the brightness difference within the difference image also changes. The larger the brightness difference, the easier it is to distinguish between the two images, meaning that it is possible that the optimal imaging conditions will change depending on the shape, material, surface finish, and so on of the component for which component orientation determination data is being created.

Thus, processing for obtaining the determination region by calculating the difference image using the multiple images of the component in different orientations under changed imaging conditions may be repeated, the imaging conditions for which the brightness difference and/or the surface area of the determination is maximized from all the imaging conditions may be selected as optimal imaging conditions, and information of those optimal imaging conditions may be included in the component orientation determination data. In this manner, it is possible for component orientation determination data that includes information of optimal imaging conditions to be easily created in a short time, even for an operator who is inexperienced in component orientation determination data creation.

Further, a determination threshold may be calculated based on the brightness value of the determination region of the image of the component in the correct orientation, and the brightness value of the determination region of the image of the component in a different orientation or the brightness difference of the determination region of the difference image, and the calculated determination threshold may be included in the component orientation determination data. In this manner, it is possible for component orientation determination data that includes an optimal threshold for which it is easy to distinguish between an image of the component in the correct orientation and an image of the component in a difference orientation to be easily created in a short time, even for an operator who is inexperienced in component orientation determination data creation.

The orientations of the component required for creating component orientation determination data will vary based on the shape and so on of the component. For example, when creating component orientation determination data for determining vertical flipping of a component for which determination of the vertical flipping (upside down flipping) is difficult based on image recognition of an outer shape of the component, an image of the component in the correct orientation and an image of the component in a vertically flipped orientation may be acquired, and a difference image between the two images calculated.

Also, when creating the component orientation determination data used for determining the orientation of a component for which determination of the correct orientation and 90 degree, 100 degree, and 270 degree flip-rotated orientations is difficult, an image of the component in the correct orientation, and images of the component flip-rotated 90 degrees, 100 degrees, 270 degrees may be acquired, and three difference images between each of the following may be calculated: the image of the component in the correct orientation and the image of the component flip-rotated 90 degrees, the image of the component in the correct orientation and the image of the component flip-rotated 100 degrees, and the image of the component in the correct orientation and the image of the component flip-rotated 270 degrees; then, based on the three calculated difference images, each of the regions for which the brightness differences is maximized or equal to or greater than a specified value may be obtained and the determination region in each of the regions may be set, and the component orientation determination data may be calculated including position information that specifies the determination regions of all of the three difference images.

Further, when determining the orientation of a component for which determination of the correct orientation and 90 degree, 100 degree, and 270 degree horizontally-rotated orientations is difficult, an image of the component in the correct orientation, and images of the component horizontally-rotated 90 degrees, 100 degrees, 270 degrees may be acquired and three difference images may be calculated between each of: the image of the component in the correct orientation and the image of the component horizontally-rotated 90 degrees, the image of the component in the correct orientation and the image of the component horizontally-rotated 100 degrees, and the image of the component in the correct orientation and the image of the component horizontally-rotated 270 degrees, and, based on the three calculated difference images, each of the regions for which the brightness differences is maximized or equal to or greater than a specified value may be obtained and a determination region candidate may be set in each of the regions, and the determination region candidate from the determination region candidates of all of the three difference images for which the brightness difference with respect to the image of the component in the correct orientation and/or the surface area is maximized may be selected as the final determination region.

The present disclosure may include an indicating means configured to indicate to an operator an orientation of the component to image in order to acquire the multiple images of the component in multiple orientations required for the component orientation determination data, and the configuration may be such that the operator, in accordance with indications of the indicating means, sets the component at an imaging position in an orientation indicated, imaging is performed by the camera, and an image of the component in the indicated orientation is acquired. In this manner, it is possible to easily acquire images of the component in the orientations required for creation of component orientation determination data, even for an operator who is inexperienced in component orientation determination data creation.

Alternatively, the configuration may be provided with an input means for an operator to enter an orientation of the component to be imaged by the camera. In this manner, even for a new component for which data of the orientations of the component required for creating component orientation determination data has not been registered, an operator can decide the orientation of the component set at the imaging position themselves, enter data for the orientation of that component, capture images of the component required for creating the component orientation determination data, and then create the component orientation determination data.

DESCRIPTION OF EMBODIMENTS

Figure 1:
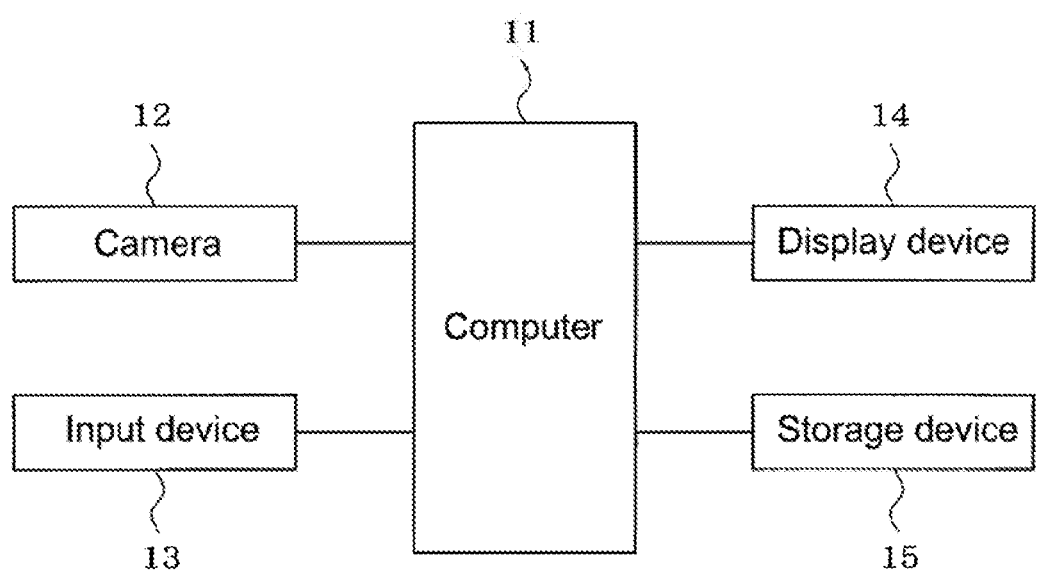
FIG. 1 is a block diagram showing an example configuration of a component orientation determination data creation device, which is an embodiment of the present disclosure.

An embodiment of the present disclosure is described below with reference to the drawings. First, an example configuration of a component orientation determination data creation device will be described based on FIG. 1.

Figure 2:
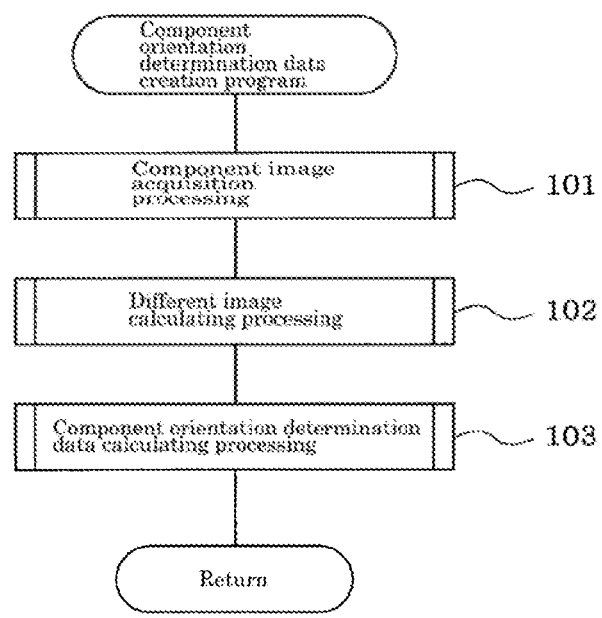
FIG. 2 is a flowchart showing the flow of processing of a component orientation determination data creation program.

The component orientation determination data creation device is provided with computer 11 such as a personal computer, camera 12 that acquires grayscale images of a component for which component orientation determination data is to be created, input device 13 (input means) such as a keyboard, mouse, or touch panel, display device 14 such as a liquid crystal display or CRT, and storage device 15 that stores the component orientation determination data creation program of FIG. 2, which is described later, and the like.

Computer 11 creates the image processing data used in image processing of a component picked up by a suction nozzle of a component mounter, and creates component orientation determination data for determining the orientation of a component for which it is difficult to determine the orientation (such as top and bottom orientation, or left and right orientation) by recognizing the outer shape by performing the component orientation determination data creation program of FIG. 2, by which component image acquisition processing (step 101) is performed by the component image acquisition means, difference image calculating processing (step 102) is performed by the difference image calculating means, and component orientation determination data calculating processing (step 103) is performed by the component orientation determination data calculating means. The component orientation determination data is included in image processing data, and when image processing of a component picked up by a suction nozzle of a component mounter is performed, the orientation of the component is determined by comparing the brightness value of a determination region within the image of the component specified in the component orientation determination data with a determination threshold.

With component image acquisition processing, processing of imaging after changing the orientation of the component for which component orientation determination data is being created with respect to camera 12 is repeated, such that multiple images of the component in different orientations required for creating the component orientation determination data are acquired.

Here, an operator performs work of setting the component at the imaging position, but, because the operator may not know the orientations of the component required for creating component orientation determination data, to acquire images of the component in the multiple orientations required for creating the component orientation determination data, an indicating function (indicating means) is provided to indicate the orientation of the component to be imaged to the operator, and when imaging a component for which data of the component orientations required for component orientation determination data is registered in storage device 15, the orientations of the component to be imaged are indicated to the operator via a display or sound of display device 14.

Also, an operator may enter the orientation of the component to be imaged by camera 12 using input device 13, so, when imaging a new component for which data of the orientations of the component required for creating component orientation determination data has not been registered, the operator can decide the orientation of the component set at the imaging position themselves, enter data for the orientation of that component, and then capture images of the component required for creating the component orientation determination data.

When it is possible to use two or more of the same component for which component orientation determination data is to be created, the two or more components can be set at the imaging positions in different orientations, and the two or more components can be imaged together in the field of range of camera 12, such that an image with two or more components in different orientations lined up can be acquired with one imaging. Of course, a single component may be placed in the field of view of camera 12 and only one orientation captured during one imaging.

In difference image calculating processing, a difference image is calculated between an image of the component in the correct orientation selected from the multiple images of the component in difference orientations, and an image of the component in a different orientation. The detailed calculation method of this difference image is described later using three examples.

In component orientation determination data calculating processing, a region within the difference image for which the brightness difference is maximized or equal to or greater than a specified value (that is, a region that can be used to clearly distinguish between an image of the component in the correct orientation and an image of the component in a different orientation) is obtained, and component orientation determination data that includes position information specifying the determination region within the region used for determining the orientation of the component is calculated.

In this case, if the imaging conditions (for example, camera 12 exposure time, lighting pattern, illumination conditions such as illumination brightness) are changed, because the waveform of the brightness difference of the difference image changes, the maximum value of the brightness difference within the difference image also changes. The larger the brightness difference, the easier it is to distinguish between the two images, meaning that it is possible that the optimal imaging conditions will change depending on the shape, material, surface finish, and so on of the component for which component orientation determination data is being created.

Thus, processing for obtaining the determination region by calculating the difference image using the multiple images of the component in different orientations under changed imaging conditions is repeated a given number of times, the imaging conditions for which the brightness difference and/or the surface area of the determination is maximized from all the imaging conditions are selected as optimal imaging conditions, and information of those optimal imaging conditions is included in the component orientation determination data.

Further, a determination threshold is calculated based on the brightness value of the determination region of the image of the component in the correct orientation, and the brightness value of the determination region of the image of the component in a different orientation or the brightness difference of the determination region of the difference image, and the calculated determination threshold is included in the component orientation determination data.

Determination threshold=$(A+B)/2=A-\Delta/2$

A: Brightness value of determination region in image of component in correct orientation B: Brightness value of determination region in image of component in different orientation $\Delta$: Brightness difference in determination region of difference image (=A−B)

Figure 3:
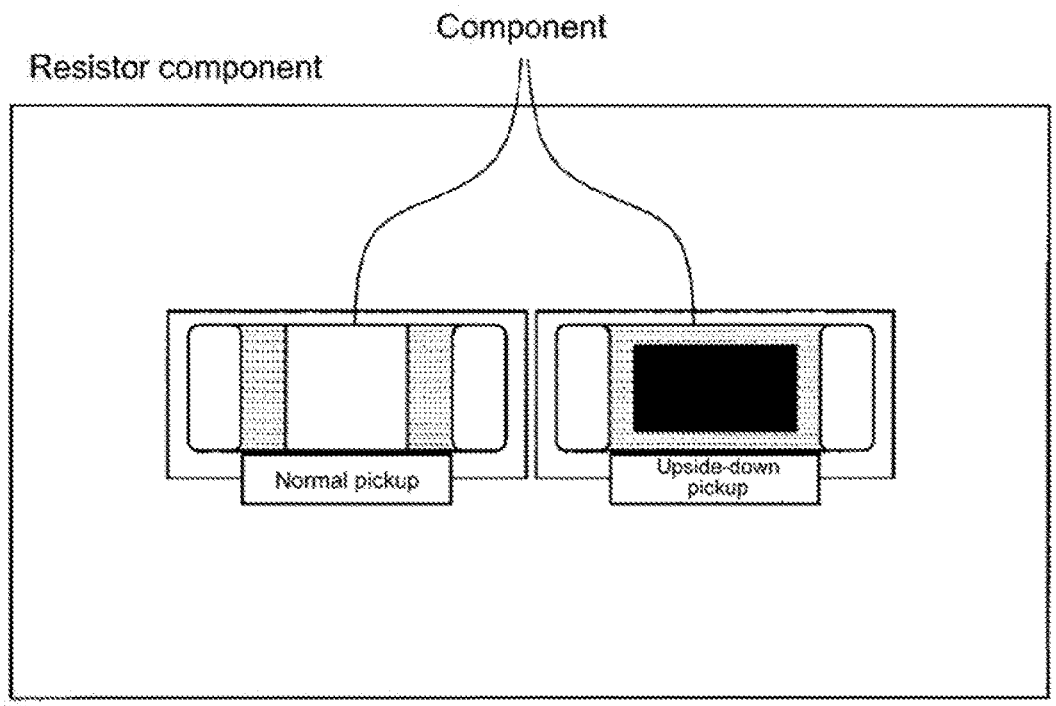
FIG. 3 shows images lined up of a component in two different orientations that are required for creating component orientation determination data of a resistor component.

However, the orientations of the component required for creating component orientation determination data will vary based on the shape and so on of the component. For example, for the resistor component shown in FIG. 3, because the component is a flat cuboid shape and the component thickness is small, it is sufficient to determine only vertical flipping (up and down flipping) (the horizontal rotation angle can be determined by image recognition of the outer shape of the component). However, because it is difficult to determine vertical flipping by image recognition of the outer shape of the component, it is necessary to create component orientation determination data for determining vertical flipping. In this case, as shown in FIG. 3, it is sufficient to acquire an image of the component in the correct orientation (normal pickup) and an image of the component flipped vertically (upside-down pickup).

Described below is the method for creating component orientation determination data for the resistor component shown in FIG. 3. The component orientation determination data of the resistor component is created by the processing of [1-1] to [1-7] below.

[1-1] A component in the correct orientation (normal pickup) and a component vertically flipped (upside-down pickup) are set at the imaging position.

[1-2] Given imaging conditions (for example, camera 12 exposure time, lighting pattern, illumination conditions such as illumination brightness) are set, and an image of the component in the correct orientation (normal pickup) and an image of the component vertically flipped (upside-down pickup) are captured by camera 12.

[1-3] Component outline data is automatically created by automatic creation processing of component outline data. Note that, instead of automatic creation processing of component outline data, an operator may enter the outer dimensions of the component using input device 13.

[1-4] The image of the component in the correct orientation (normal pickup) is processed, the outer shape of the component is recognized, and the center position and rotation angle of the component are obtained; further, the image of the component vertically flipped (upside-down pickup) is processed, the outer shape of the component is recognized, and the center position and rotation angle of the component are obtained.

Figure 4:
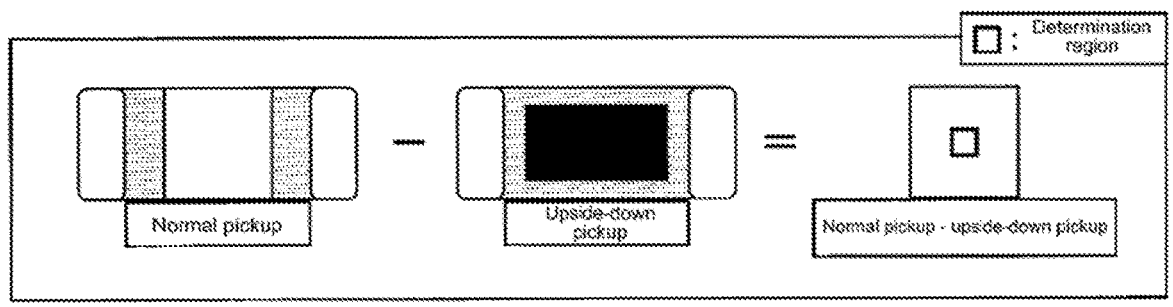
FIG. 4 illustrates difference image calculating processing and component orientation determination data calculating processing for creating component orientation determination data of a resistor component.

[1-5] A difference image of the two images is calculated by aligning the center position and rotation angle of the component in the two images (refer to FIG. 4), the region within the difference region for which the brightness difference is maximized or equal to or greater than a specified value (that is, a region by which the two images can be clearly distinguished) is obtained, and position information of the region is stored in memory such as RAM along with the imaging conditions.

[1-6] The steps of [1-2] to [1-5] above are repeated a specified number of times changing the imaging conditions each time the steps of [1-2] to [1-5] are performed. Thus, for the specified number of imaging conditions, the region within the difference image for which the brightness difference is maximized or equal to or greater than a specified value is obtained, and position information of the region is stored in memory such as RAM along with the imaging conditions.

[1-7] From all the stored imaging conditions, the imaging conditions for which the brightness difference and/or the surface area of the determination region is maximized are selected as optimal imaging conditions, and from the difference image obtained under the optimal imaging conditions, a determination region for determining the orientation of the component that is a central portion (the shape center or the center of gravity) of the region for which the brightness difference is maximized or equal to or greater than a specified value is set, and a determination threshold is calculated based on the brightness difference between the brightness value of the determination region of the image of the component in the correct orientation (normal pickup) obtained under the optimal conditions, and the brightness value of the determination region of the image of the vertically flipped component (upside-down pickup) or the brightness difference of the determination region of the difference image. In this manner, the optimal imaging conditions, the position information of the determination region, and the determination threshold are linked to the identification information or the like of the component, and stored in storage device 15 as component orientation determination data. Note that, the size (surface area) of the determination region is set considering the tolerance for the position deviation of the image recognition such that a specified size or greater for which the determination region can definitely be recognized is guaranteed.

Figure 5:
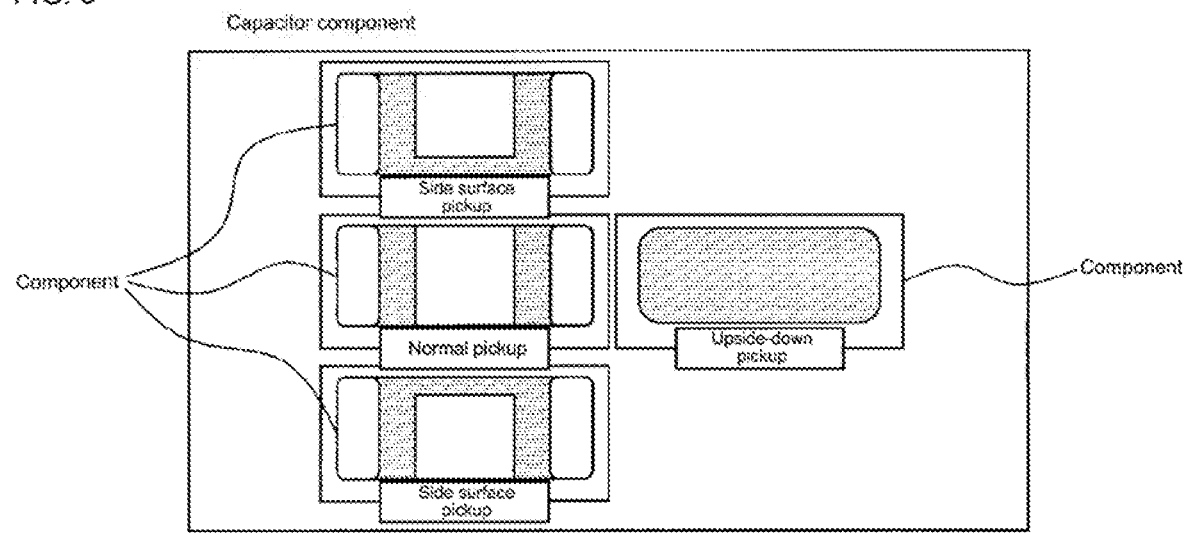
FIG. 5 shows images lined up of a component in four different orientations that are required for creating component orientation determination data of a capacitor component.

Further, in a case of a capacitor component as shown in FIG. 5, because both ends of the component are square and the thickness of the component is large, it is necessary to determine based on four orientations: the correct orientation (normal pickup), 90-degree flip rotation (side surface pickup), 180-degree flip rotation (upside-down pickup), and 270-degree flip rotation (side pickup) (the rotation angle of the component in the horizontal orientation can be determined by image processing of the outer shape of the component). However, because it is difficult to determine the four orientations above by image recognition of the outer shape of the component, it is necessary to create component orientation determination data for determining the above four orientations. In this case, as shown in FIG. 5, it is sufficient to acquire an image of the component in the correct orientation, and images of the component flipped vertically by 90 degrees, 100 degrees, and 270 degrees.

Described below is the method for creating component orientation determination data for the capacitor component shown in FIG. 5. The component orientation determination data of the capacitor component is created by the processing of [2-1] to [2-9] below.

[2-1] A component in the correct orientation (normal pickup), a component vertically rotated 90 degrees (side surface pickup), a component vertically rotated 180 degrees (upside-down pickup), and a component vertically rotated 270 degrees (side surface pickup) are set at the imaging position.

[2-2] Given imaging conditions are set and images of the component in the above four orientations are captured by camera 12.

[2-3] Component outline data is automatically created by automatic creation processing of component outline data. Note that, instead of automatic creation processing of component outline data, an operator may enter the outer dimensions of the component using input device 13.

[2-4] The images of the components in each orientation are processed, the outer shape of the components in each orientation are recognized, and the center position and angle rotation of the components in each orientation are obtained.

[2-5] By aligning the center position and rotation angle of the component in the image of the component in the correct orientation (normal pickup) and the image of the component flip-rotated 90 degrees (side surface pickup), a difference image of the two images is calculated (refer to FIG. 6[*a*]), the region within the difference region for which the brightness difference is maximized or equal to or greater than a specified value is obtained, and position information of the region is stored in memory such as RAM along with the imaging conditions.

[2-6] By aligning the center position and rotation angle of the component in the image of the component in the correct orientation (normal pickup) and the image of the component flip-rotated 100 degrees (upside-down pickup), a difference image of the two images is calculated (refer to FIG. 6[*c*]), the region within the difference region for which the brightness difference is maximized or equal to or greater than a specified value is obtained, and position information of the region is stored in memory such as RAM along with the imaging conditions.

[2-7] By aligning the center position and rotation angle of the component in the image of the component in the correct orientation (normal pickup) and the image of the component flip-rotated 270 degrees (side surface pickup), a difference image of the two images is calculated (refer to FIG. 6[*b*]), the region within the difference region for which the brightness difference is maximized or equal to or greater than a specified value is obtained, and position information of the region is stored in memory such as RAM along with the imaging conditions.

[2-8] The steps of [2] to [2-7] above are repeated a specified number of times changing the imaging conditions each time the steps of [2-2] to [2-7] are performed. Thus, for the specified number of imaging conditions, the region within the three difference images for which the brightness difference is maximized or equal to or greater than a specified value is obtained, and position information of the region is stored in memory such as RAM along with the imaging conditions.

[2-9] From all the stored imaging conditions, the imaging conditions for which the brightness difference and/or the surface area of the determination region is maximized are selected as optimal imaging conditions, and from the three difference images obtained under the optimal imaging conditions, a determination region for determining the orientation of the component that is a central portion (the shape center or the center of gravity) of the region for which the brightness difference is maximized or equal to or greater than a specified value is set, and a determination threshold is calculated based on the brightness difference between the brightness value of the determination region of the image of the component in the correct orientation (normal pickup) obtained under the optimal conditions, and the brightness value of the determination region of the image of the component in a different orientation or the brightness difference of the determination region of each of the difference images. In this manner, the optimal imaging conditions, the position information of the determination region of the three difference images, and the determination threshold are linked to the identification information or the like of the component, and stored in storage device 15 as component orientation determination data. Note that, the size (surface area) of the determination region is set considering the tolerance for the position deviation of the image recognition such that a specified size or greater for which the determination region can definitely be recognized is guaranteed.

Figure 6:
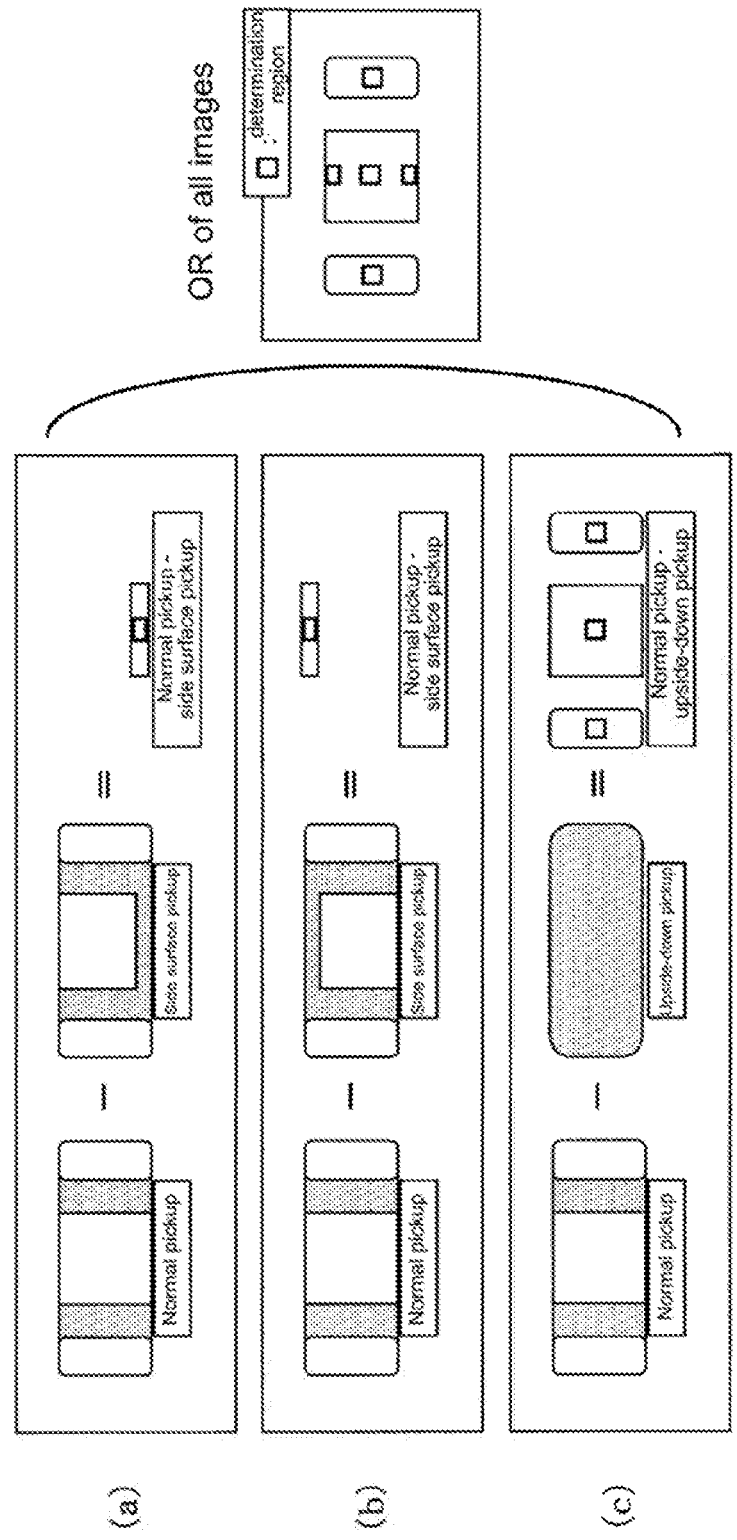
FIG. 6 illustrates difference image calculating processing and component orientation determination data calculating processing for creating component orientation determination data of a capacitor component.

With the two difference images shown in FIGS. 6(*a*) and (*b*), one determination region is set for each; for the difference image shown in FIG. 6(*c*), because there are three regions for which the brightness difference is maximized or equal to or greater than a specified value, there are three determination regions set in the center portion of those regions. Thus, component orientation determination data of the capacitor component includes a total of five determination regions. The final determination region, is the logical sum of the determination regions obtained in the three difference images shown in FIGS. 6(*a*) to (*c*).

Figure 7:
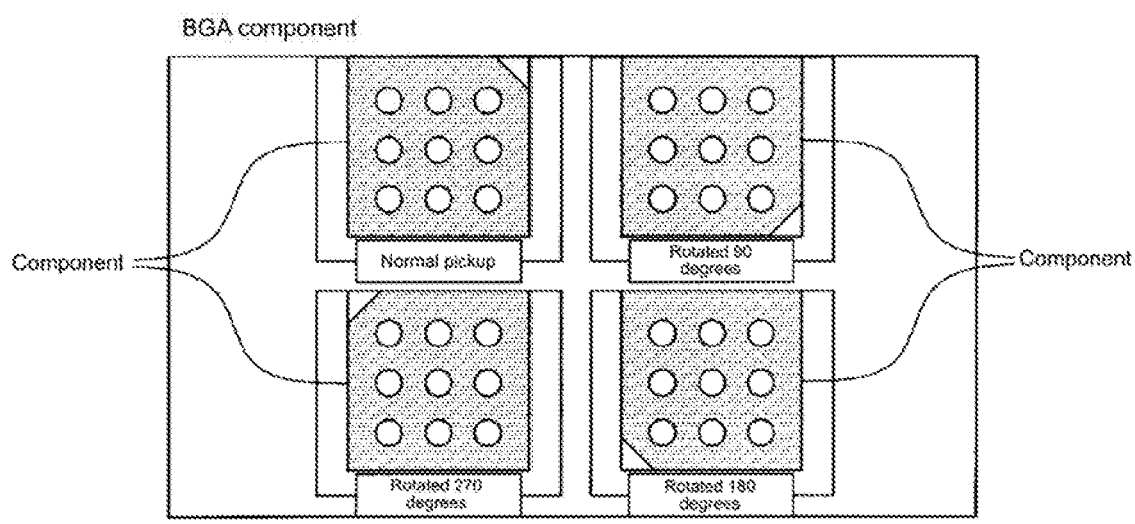
FIG. 7 shows images lined up of a component in four different orientations that are required for creating component orientation determination data of a BGA component.

Further, for the BGA component shown in FIG. 7, because the component is a flat cuboid, it is sufficient to determine the correct orientation (0 degrees) and orientations horizontally rotated by 90 degrees, 100 degrees, and 270 degrees, however, because it is difficult to determine the four orientations above by image recognition of the outer shape of the component, it is necessary to create component orientation determination data for determining the above four orientations. In this case, as shown in FIG. 7, it is sufficient to acquire an image of the component in the correct orientation (0 degrees), and images of the component rotated horizontally by 90 degrees, 100 degrees, and 270 degrees.

Described below is the method for creating component orientation determination data for the BGA component shown in FIG. 7. The component orientation determination data of the BGA component is created by the processing of [3-1] to [3-9] below.

[3-1] A component in the correct orientation (0 degrees), a component horizontally rotated 90 degrees, a component horizontally rotated 100 degrees, and a component horizontally rotated 270 degrees are set at the imaging position.

[3-2] Given imaging conditions are set and images of the component in the above four orientations are captured by camera 12.

[3-3] Component outline data is automatically created by automatic creation processing of component outline data. Note that, instead of automatic creation processing of component outline data, an operator may enter the outer dimensions of the component using input device 13.

[3-4] The images of the components in each orientation are processed, the outer shape of the components in each orientation are recognized, and the center position and angle rotation of the components in each orientation are obtained.

Figure 8:
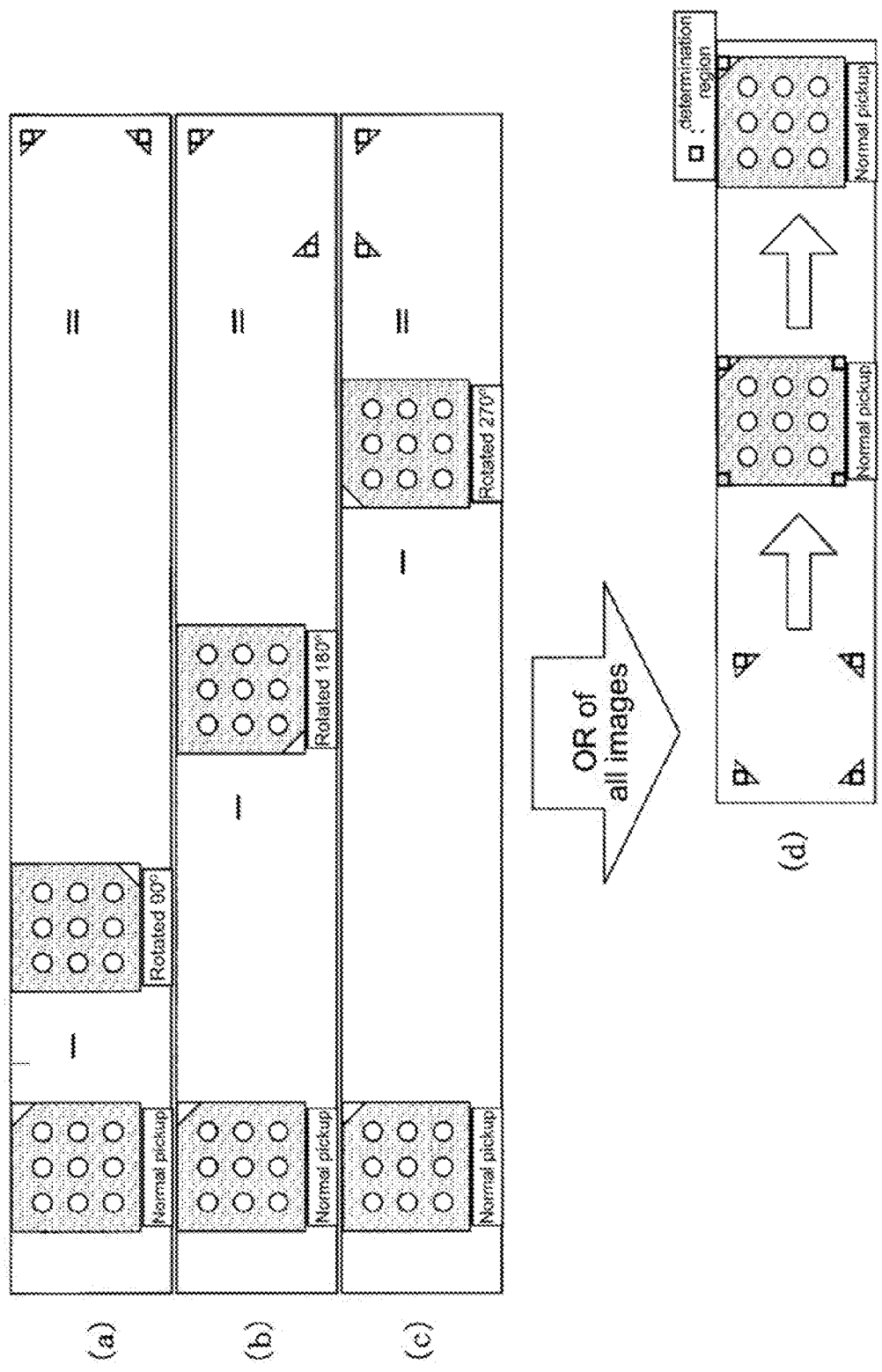
FIG. 8 illustrates difference image calculating processing and component orientation determination data calculating processing for creating component orientation determination data of a BGA component.

[3-5] By aligning the center position and rotation angle of the component in the image of the component in the correct orientation (0 degrees) and the image of the component horizontally rotated 90 degrees, a difference image of the two images is calculated (refer to FIG. 8[*a*]), the region within the difference region for which the brightness difference is maximized or equal to or greater than a specified value is obtained, and position information of the region is stored in memory such as RAM along with the imaging conditions.

[3-6] By aligning the center position and rotation angle of the component in the image of the component in the correct orientation (0 degrees) and the image of the component horizontally rotated 100 degrees, a difference image of the two images is calculated (refer to FIG. 8[b]), the region within the difference region for which the brightness difference is maximized or equal to or greater than a specified value is obtained, and position information of the region is stored in memory such as RAM along with the imaging conditions.

[3-7] By aligning the center position and rotation angle of the component in the image of the component in the correct orientation (0 degrees) and the image of the component horizontally rotated 270 degrees, a difference image of the two images is calculated (refer to FIG. 8[c]), the region within the difference region for which the brightness difference is maximized or equal to or greater than a specified value is obtained, and position information of the region is stored in memory such as RAM along with the imaging conditions.

[3-8] The steps of [3-2] to [3-7] above are repeated a specified number of times changing the imaging conditions each time the steps of [3-2] to [3-7] are performed. Thus, for the specified number of imaging conditions, the region within the three difference images for which the brightness difference is maximized or equal to or greater than a specified value is obtained, and position information of the region is stored in memory such as RAM along with the imaging conditions.

[3-9] From all the stored imaging conditions, the imaging conditions for which the brightness difference and/or the surface area of the determination region is maximized are selected as optimal imaging conditions, and from the three difference images obtained under the optimal imaging conditions, a determination region candidate in a central portion (the shape center or the center of gravity) of the region for which the brightness difference is maximized or equal to or greater than a specified value is set, the logical sum of the determination region candidates of all of the three difference images is obtained, and the determination region candidate for which the brightness difference with respect to the image of the component in the correct orientation (0 degrees) and/or the surface area is maximized is selected as the final determination region. Further, a determination threshold is calculated based on the brightness value of the determination region of the image of the component in the correct orientation (0 degrees) under optimal imaging conditions, and the brightness value of the determination region of the image of the component in a different orientation or the brightness difference of the determination region of each difference image. In this manner, the optimal imaging conditions, the position information of the determination region, and the determination threshold are linked to the identification information or the like of the component, and stored in storage device 15 as component orientation determination data. Note that, the size (surface area) of the determination region is set considering the tolerance for the position deviation of the image recognition such that a specified size or greater for which the determination region can definitely be recognized is guaranteed.

In the three difference images shown in FIGS. 8(a) to (c), two determination region candidates each are set, and four determination region candidates are obtained by the logical sum of the determination region candidates of the three difference images, but in final processing, from these four determination region candidates, the determination region candidate for which the brightness difference with respect to the image of the component in the correct orientation (0 degrees) and/or the surface area is maximized is selected as the final determination region.

With the above embodiment, by calculating a difference image between an image of the component in the correct orientation and an image of the component in another orientation, it is possible to easily automatically determine a region for which the brightness difference between the image of the component in the correct orientation and the image of the component in the other orientation is greatest or equal to or greater than a specified value (that is, a region by which the two images can be clearly distinguished) from a waveform of the brightness difference of the difference image. Thus, it is possible for appropriate component orientation determination data to be easily created in a short time, for the accuracy of component orientation determination to be improved, and for production of defective boards to be prevented, even for an operator who is inexperienced in component orientation determination data creation.

Also, because processing for obtaining the determination region by calculating the difference image using the multiple images of the component in different orientations under changed imaging conditions is repeated, the imaging conditions for which the brightness difference and/or the surface area of the determination is maximized from all the imaging conditions are selected as optimal imaging conditions, and information of those optimal imaging conditions is included in the component orientation determination data, it is possible for component orientation determination data that includes information of optimal imaging conditions to be easily created in a short time, even for an operator who is inexperienced in component orientation determination data creation.

Further, because a determination threshold is calculated based on the brightness value of the determination region of the image of the component in the correct orientation, and the brightness value of the determination region of the image of the component in a different orientation or the brightness difference of the determination region of the difference image, and the calculated determination threshold is included in the component orientation determination data, it is possible to create component orientation determination data including an appropriate determination threshold for which it is easy to distinguish between an image of a component in a correct orientation and an image of a component in a different orientation easily and in a short time, even for an operator who is inexperienced in component orientation determination data creation.

Note that, the present disclosure may create component orientation determination data using a component mounter, in which case, a component for which the component orientation determination data is to be created is picked up by a suction nozzle of the component mounter, and the component is imaged from below using a component recognition camera of the component mounter.

In addition, it goes without saying that the present disclosure is not limited to the above embodiment, and various embodiments with changes that do not extend beyond the scope of the disclosure are possible, such as appropriate changes to the search method of the optimal imaging conditions, or the calculation method of the determination threshold.

REFERENCE SIGNS LIST

11: computer (difference image calculating means, component orientation determination data calculating means, indicating means); 12: camera; 13: input device (input means); 14: display device; 15: storage device

The invention claimed is:

1. A component orientation determination data creation device for creating component orientation determination data used in a component orientation determination system that determines an orientation of the component by comparing a brightness value of a determination region specified in the component orientation determination data within an image of the component captured by a camera with a determination threshold, the component orientation determination data creation device comprising:

processing circuitry configured to calculate for a predetermined number of imaging conditions a difference image between an image of the component in a correct orientation and an image of the component in an other orientation acquired at each of the predetermined number of imaging conditions, by comparing the image of the component in the correction orientation and the image of the component in the other orientation by aligning a respective center position and a rotation angle of the component;

obtain a brightness difference region for which a brightness difference within each difference image at each of the predetermined number of imaging conditions is maximized;

select an optimal imaging condition among the predetermined number of imaging conditions for which a brightness difference is maximized from all of the imaging conditions obtained by comparing the brightness difference regions at each of the predetermined number of imaging conditions;

include information of the optimal imaging condition in the component orientation determination data;

from the difference image under the optimal imaging condition, select as the determination region a center of the difference region for which the brightness difference is maximized; and calculate a determination threshold based on a brightness value of the determination region of the image of the component in the correct orientation, and a brightness value of the determination region of the image of the component in a different orientation or a brightness difference of the determination region of the difference image, and includes the calculated determination threshold in the component orientation determination data.

2. The component orientation determination data creation device according to claim 1, wherein the processing circuitry is configured to create the component orientation determination data used for determining vertical flipping of a component for which determination of vertical flipping is difficult based on image recognition of an outer shape of the component, and acquire an image of the component in the correct orientation and an image of the component that has been vertically flipped and calculates the difference image of the acquired images.

3. The component orientation determination data creation device according to claim 1, wherein the processing circuitry is configured to create the component orientation determination data used for determining the orientation of a component for which determination of the correct orientation and 90 degree, 180 degree, and 270 degree flip-rotated orientations is difficult, acquire an image of the component in the correct orientation, and images of the component flip-rotated 90 degrees, 180 degrees, 270 degrees and calculates three difference images between each of: the image of the component in the correct orientation and the image of the component flip-rotated 90 degrees, the image of the component in the correct orientation and the image of the component flip-rotated 180 degrees, and the image of the component in the correct orientation and the image of the component flip-rotated 270 degrees, based on the three difference images, obtain each of the regions for which the brightness differences is maximized or equal to or greater than a specified value and sets the determination region in each of the regions, and calculate the component orientation determination data including position information that specifies the determination regions of all of the three difference images.

4. The component orientation determination data creation device according to claim 1, wherein the processing circuitry is configured to create the component orientation determination data used for determining the orientation of a component for which determination of the correct orientation and 90 degree, 180 degree, and 270 degree horizontally-rotated orientations is difficult, acquire an image of the component in the correct orientation, and images of the component horizontally-rotated 90 degrees, 180 degrees, 270 degrees and calculates three difference images between each of: the image of the component in the correct orientation and the image of the component horizontally-rotated 90 degrees, the image of the component in the correct orientation and the image of the component horizontally-rotated 180 degrees, and the image of the component in the correct orientation and the image of the component horizontally-rotated 270 degrees, and based on the three difference images calculated by the difference image calculating means, obtain each of the regions for which the brightness differences is maximized or equal to or greater than a specified value and sets a determination region candidate in each of the regions, and select the determination region candidate from the determination region candidates of all of the three difference images for which the brightness difference with respect to the image of the component in the correct orientation as the determination region.

5. The component orientation determination data creation device according to claim 1, wherein the processing circuitry is configured to indicate to an operator an orientation of the component to image in order to acquire the multiple images of the component in multiple orientations required for the component orientation determination data, and in accordance with the orientation indicated, set the component at an imaging position in an orientation indicated, imaging is performed by the camera, and an image of the component in the indicated orientation is acquired.

6. The component orientation determination data creation device according to claim 1, further including an input device configured to allow an operator to enter the orientation of the component to be imaged by the camera.

* * * * *